(12) United States Patent
McClure

(10) Patent No.: US 6,252,447 B1
(45) Date of Patent: *Jun. 26, 2001

(54) EDGE TRANSITION DETECTION CIRCUIT WITH VARIABLE IMPEDANCE DELAY ELEMENTS

(75) Inventor: David Charles McClure, Carrollton, TX (US)

(73) Assignee: STMicroelectronics, Inc., Carrollton, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,225

(22) Filed: Aug. 25, 1998

Related U.S. Application Data

(62) Division of application No. 08/801,452, filed on Feb. 18, 1997, now Pat. No. 6,014,050, which is a continuation of application No. 08/507,023, filed on Jul. 25, 1995, now abandoned, which is a continuation of application No. 08/100,624, filed on Jul. 30, 1993, now abandoned.

(51) Int. Cl.$^7$ ...................................................... H03K 7/08
(52) U.S. Cl. ............................ 327/175; 327/26; 327/264; 327/281
(58) Field of Search ..................................... 327/261, 263, 327/264, 276, 278, 277, 281, 284, 285, 392–394, 396, 172–175, 24–26; 365/233, 233.5, 194, 195, 201; 375/238, 239

(56) References Cited

U.S. PATENT DOCUMENTS

| 5,055,706 | 10/1991 | Nakai et al. ........................ 323/288 |
| 5,376,848 | * 12/1994 | Hanke et al. ......................... 327/141 |
| 5,418,756 | * 5/1995 | McClure ............................ 365/233.5 |
| 5,506,534 | * 4/1996 | Guo et al. ............................ 327/276 |
| 5,790,612 | * 8/1998 | Chengson et al. .................... 375/373 |

FOREIGN PATENT DOCUMENTS

| 0451079 | 10/1991 | (EP) . |
| 61-052022 | 3/1986 | (JP) . |
| 2290328 | 11/1990 | (JP) . |
| WO 92/16051 | 9/1992 | (WO) . |

* cited by examiner

Primary Examiner—Timothy P. Callahan
Assistant Examiner—Minh Nguyen
(74) Attorney, Agent, or Firm—Theodore E. Galanthay; Lisa K. Jorgenson; Michelle Larson

(57) ABSTRACT

According to the present invention, by setting the logic state of one or more delay signals to appropriate values, the resistive value of a plurality of power supply delay elements throughout an integrated circuit having distributed circuit blocks may be modified to produce desired delay times or pulse width adjustments throughout the integrated circuit. Setting delay signals to desired logic states may be accomplished by a variety of means including forcing test pads to a logic level, blowing fuses, or entering into a test mode.

9 Claims, 4 Drawing Sheets

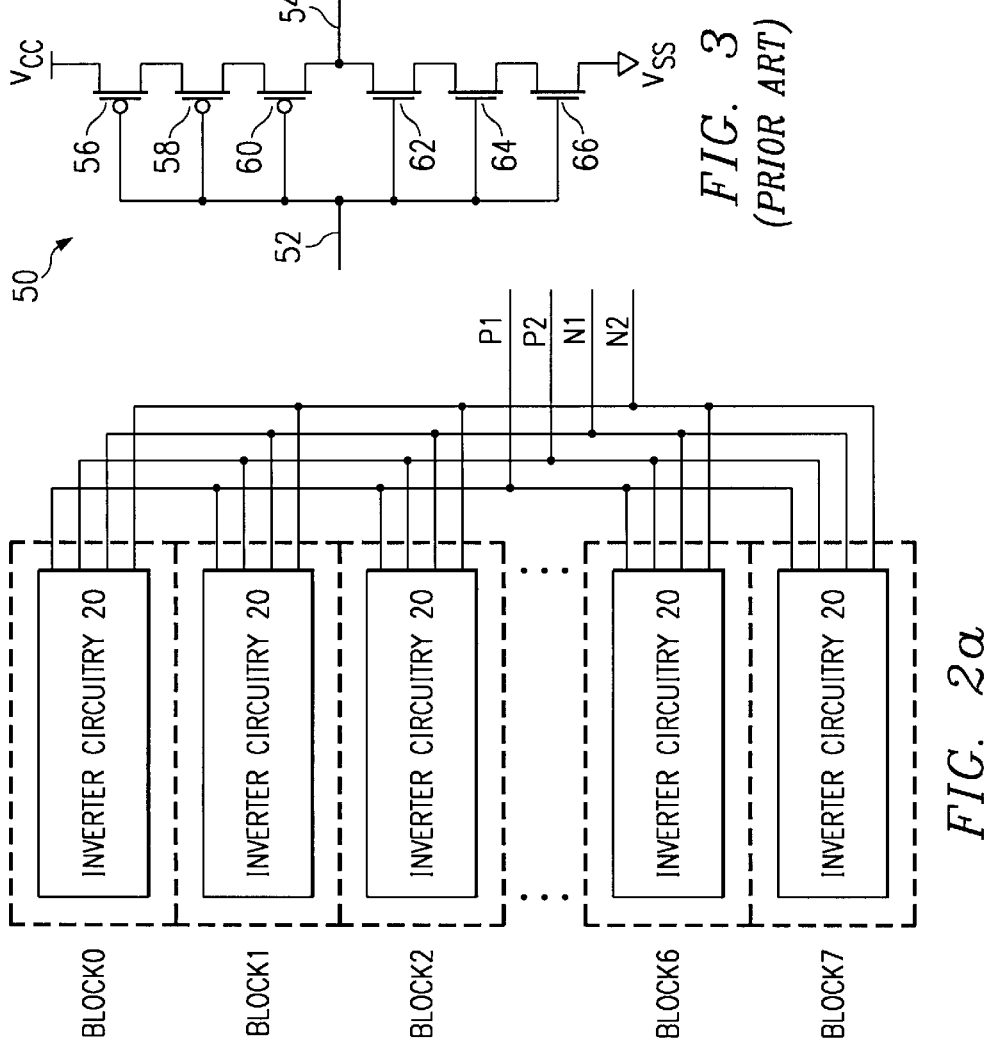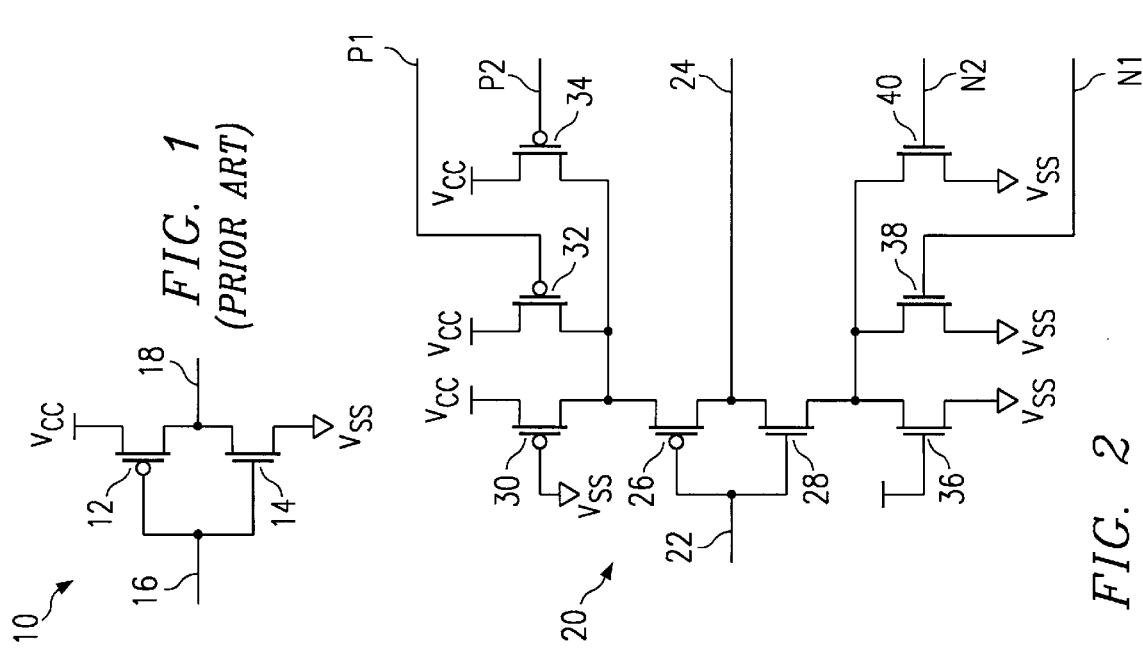

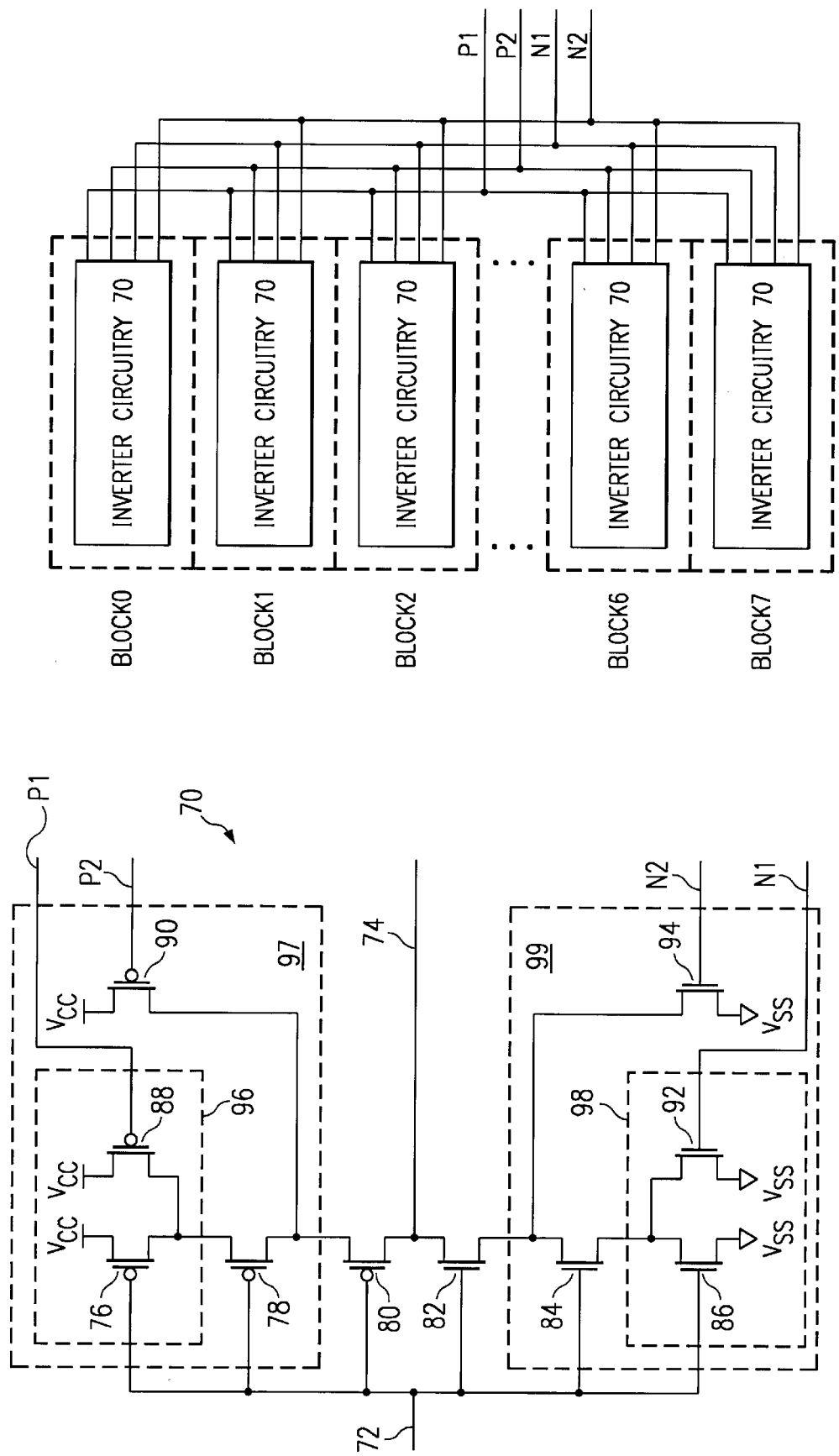

EDGE TRANSITION DETECTION CIRCUIT WITH VARIABLE IMPEDANCE DELAY ELEMENTS

CROSS REFERENCE TO RELATED APPLICATIONS

This application is a division of application Ser. No. 08/801,452, filed Feb. 18, 1997 and issued as U.S. Pat. No. 6,014,050 on Jan. 11, 2000, which is a continuation of application Ser. No. 08/507,023, filed on Jul. 25, 1995, now abandoned, which in turn is a continuation of application Ser. No. 08/100,624, filed on Jul. 30, 1993, now abandoned, which are hereby incorporated by reference.

The subject matter of the present application is related to United States application, titled "Fuse Delay Circuit", Ser. No. 08/085,580, filed on Jun. 30, 1993, now issued U.S. Pat. No. 5,428,311, assigned to the assignee hereof, and which is herein incorporated by reference.

BACKGROUND OF THE INVENTION

1. Field of the Invention

The present invention relates generally to integrated circuit devices, and more specifically to variable impedance power supply delay elements for use in such integrated circuit devices.

2. Description of the Prior Art

Throughout the design, test, and manufacture of integrated circuit devices, such as memory devices, there exists the need to determine circuit performance. Especially during circuit debug, speed optimization, and yield optimization, certain device parameters and corresponding critical signals must be evaluated. Such critical signals may include sense amp timing, set-up and hold times, rise and falls times, etc. Evaluation of critical signals is often accomplished by introducing delays to the critical signals to change the timing of these critical signals and then measuring how the circuit responds to such delays.

Introduction of delays is often controlled by delay elements. It is often necessary to distribute delay elements throughout the integrated circuit in order to effect a global delay for a critical signal, since the critical signal may be distributed across a chip or within repeated circuit blocks. For example, sense amp timing delays are often times found in each memory block. It is common for sense amp timing delays to be introduced to 8, 16, 32, or more circuit blocks.

There are several methods currently used in the art to introduce delays in critical signal timing. Adjustments in the delay of critical signals may be accomplished using experimental masks, but this is costly and time consuming. It could be done using a focused ion beam (FIB), but when a number of circuit blocks must be adjusted, this can be quite time consuming, prone to error, and expensive. FIB is best suited for adjusting the circuitry at a limited number of locations, rather than repetitive operations. Also, FIB does not allow for production adjustment by blowing fuses and is therefore not ideal for a production environment. Additionally, placing fuses in each delay circuit takes a great deal of layout area and is cumbersome to layout in the central block control area of the chip.

To date, methods for introducing delays to critical integrated circuit signals have required the placement of delay elements throughout the integrated circuit in distributed circuit blocks. The distribution of delay elements throughout the integrated circuit means that adjustments to these delay elements must be made at multiple locations. Methods currently used to do this, as described above, may be time consuming, prone to error, expensive, and not desirable for a production device.

SUMMARY OF THE INVENTION

It is therefore an object of the present invention to globally adjust the delay of critical signals or pulse widths throughout an integrated circuit device having distributed circuit blocks.

It is therefore further an object of the present invention to adjust the delay of such signals in such a manner so as to be layout efficient.

It is therefore further an object of the present invention to adjust the delay of such signals in such a manner so as to be transparent to the normal operating mode of the integrated circuit.

Therefore, according to the present invention, by setting the logic state of one or more delay signals to appropriate values, the resistive value of a plurality of power supply delay elements throughout an integrated circuit having distributed circuit blocks may be modified to produce desired delay times or pulse width adjustments throughout the integrated circuit. Setting delay signals to desired logic states may be accomplished by a variety of means including forcing test pads to a logic level, blowing fuses, or entering into a test mode.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1 is an inverter of a first type commonly used in the switching elements of integrated circuits, according to the prior art;

FIG. 2 is inverter circuitry which allows the impedance of power supply delay elements to be modified, according to a first embodiment of the present invention;

FIG. 2a is inverter circuitry 20 of FIG. 2 duplicated in a plurality of circuit blocks of an integrated circuit device.

FIG. 3 is inverter circuitry of a second type commonly used in switching elements of integrated circuits according to the prior art;

FIG. 4 is inverter circuitry which allows the impedance of power supply delay elements to be modified, according to a second preferred embodiment of the invention;

FIG. 4a is inverter circuitry 70 of FIG. 4 duplicated in a plurality of circuit blocks of an integrated circuit device.

DESCRIPTION OF THE INVENTION

Figure 6A:
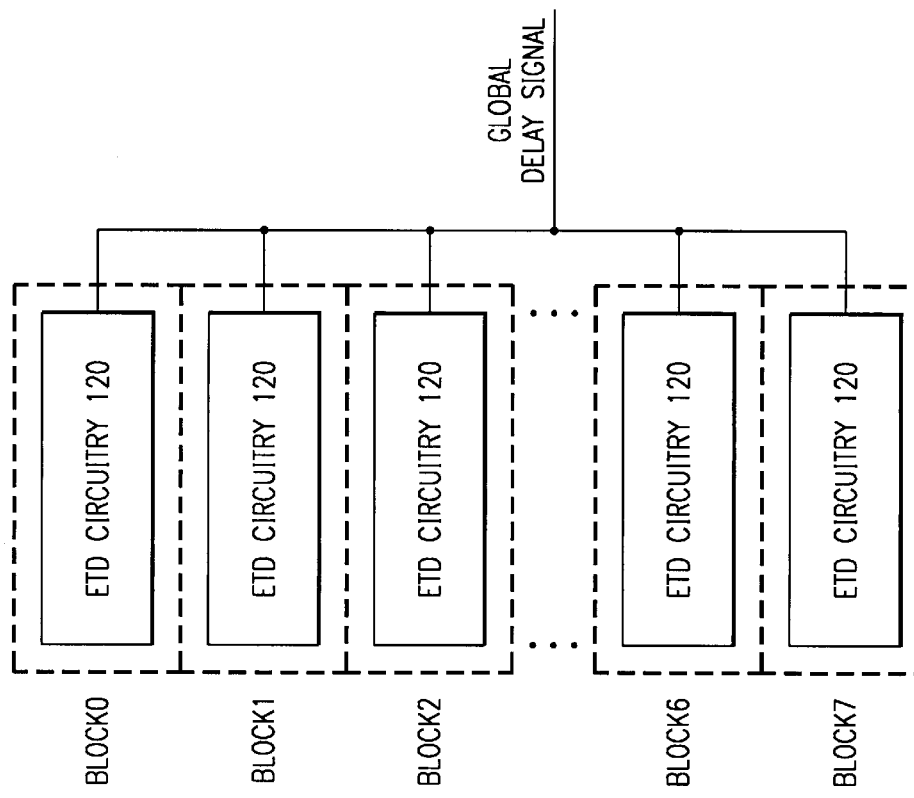
FIG. 6a is ETD circuitry 120 of FIG. 6 duplicated in a plurality of circuit blocks of an integrated circuit device.

It is necessary to have the capability to introduce delays in the timing of critical integrated circuit signals or to alter pulse widths, such that these signals or pulse widths may be evaluated at various stages of design, testing, and manufacturing. In the past, this has been accomplished by placing delay elements in multiple distributed circuit blocks. However, there are difficulties with this approach as outlined in the Description of the Prior Art above.

Referring to FIG. 1, an inverter 10 of a first type commonly used in the switching elements for integrated circuits according to the prior art is shown. Inverter 10 comprises a p-channel transistor 12, which is connected to power supply $V_{CC}$, and an n-channel transistor 14, which is connected to power supply $V_{SS}$, as shown. Input signal 16 is inverted by inverter 10 which generates output signal 18. Inverter 10 may be replaced by a variety of other logic gates such as a NAND gate or a NOR gate.

According to the present invention, modification of inverter 10 allows for the impedance, i.e. the resistance, of the power supplies of the switching elements of an integrated circuit to be modulated, thereby modulating the amount of delay introduced. Referring to FIG. 2, inverter 10 of FIG. 1 has been replaced with inverter circuitry 20 which allows the impedance of power supplies $V_{CC}$ and $V_{SS}$ to be modified, according to a first embodiment of the invention. Input signal 22 is inverted by inverter circuitry 20 which generates output signal 24. In the positive voltage portion of inverter circuitry 20, P-channel transistor 30 is connected in series with p-channel transistor 26, the gate of transistor 30 is connected to the $V_{SS}$ power supply, and transistors 26 and 30 are connected to the $V_{CC}$ power supply. P-channel transistor 32 and p-channel transistor 34 are connected in parallel to each other and to p-channel transistor 30. In the negative voltage portion of inverter circuitry 20, n-channel transistor 36 is connected in series with n-channel transistor 28, the gate of transistor 36 is connected to the $V_{CC}$ power supply, and transistors 28 and 36 are connected to the $V_{SS}$ power supply. N-channel transistors 38 and 40 are connected in parallel to each other and to n-channel transistor 36. The gates of transistors 30 and 36 may each be connected to input signal 22, rather than being connected to the $V_{SS}$ power supply and the $V_{CC}$ power supply, respectively.

In the positive voltage portion of inverter circuitry 20, the gates of transistors 32 and 34 are driven by delay signals P1 and P2, respectively, which determine the amount of delay which will be introduced to the integrated circuit in the positive voltage direction. The resistive value of transistors 30, 32, and 34 are chosen such that when the value of delay signals P1 and P2 are appropriately chosen, the resultant resistive value in series with transistor 26 causes the desired delay in the circuit. For purposes of illustration, suppose the resistance of transistor 30 to be bigger than the resistance of transistor 32 which, in turn, is bigger than the resistance of transistor 34. When delay signals P1 and P2 are both equal to a logic low state, transistors 26, 30, 32, and 34 are turned on, and the resultant resistance in series with transistor 26 is equal to the resistive values of transistors 30, 32, and 34 in parallel with each other. Having P1 and P2 equal to a logic high state yields the largest resistance allowable for inverter circuitry 20: the resistive value of transistor 26 connected in series with the resistive value of transistor 30. The delay introduced to the switching circuitry of power supply $V_{CC}$, therefore, is correspondingly large.

It is possible to introduce a longer delay in inverter circuitry 20 by varying the values of delay signals P1 and P2. When delay signal P1 is equal to a logic high state and delay signal P2 is equal to a logic low state, transistor 32, having medium resistive value, is turned off, but transistors 30 and 34 are still on. The resultant resistance in series with transistor 26 is then the resistance of transistor 30 in parallel with the resistance of transistor 34. This resultant resistance is greater than the resistance formed when both P1 and P2 are at a logic low state as described above, and thus produces more delay. Therefore, by setting only delay signal P1 to a logic high state, it is possible to generate a longer delay than when both delay signals P1 and P2 are at a logic low state. Yet another delay time may be achieved by setting delay signal P2 to a logic high state, such that transistor 34 is turned off, and setting delay signal P1 to a logic low state. The resultant resistance in series with transistor 26 is equal to the value of the resistance of transistor 30 in parallel with the resistance of transistor 32.

As described, delay signals P1 and P2 may be set to the appropriate logic levels to produce a desired delay in the positive voltage direction, i.e. in the $V_{CC}$ direction. Delay signals N1 and N2 have synonymous uses, but for the negative voltage direction, i.e. in the $V_{SS}$ direction. Therefore, delay signals N1 and N2 may each be set to a logic high state or a logic low state to produce desired delays in the negative going voltage direction. In this case, the desired delay would be produced by manipulating the resistances of transistors 36, 38, and 40 such that a desired resultant resistance in series with n-channel transistor 28 results.

The function of delay signals P1, P2, N1, and N2 have been described above. According to the present invention, these delay signals may be used to obtain global delay throughout an integrated circuit device. Referring to FIG. 2a, inverter circuitry 20 of FIG. 2 has been duplicated in a number of distributed circuit blocks Block0 to Block7, for instance, throughout an integrated circuit device such that by simply manipulating the four global delay signals P1, P2, N1, and N2, delays of differing amounts may be achieved throughout the device. Additionally, more delay times may be obtained by adding additional transistors in parallel with transistors 32 and 34. This is a highly desirable feature of the present invention in that it allows for a single fuse to be blown, a single test pad to be forced to a given logic level, or a test mode to be entered in order to set a delay signal to the desired logic state throughout an entire chip.

Referring to FIG. 3, inverter circuitry 50 of a second type commonly used in switching circuitry of integrated circuits according to the prior art, is shown. Input signal 52 is inverted by inverter circuitry 50 which generates output signal 54, which is comprised of three series p-channel transistors 56, 58, and 60 and three series n-channel transistors 62, 64, and 66. Transistors 56, 58, and 60 are connected in series to $V_{CC}$, a high voltage state, and transistors 62, 64, and 66 are connected in series to $V_{SS}$, a low voltage state, as shown in FIG. 3. The amount of delay in the circuit is determined by the resistive value of the transistors. For instance, assuming delay in the positive voltage direction, or $V_{CC}$, the delay is determined by the resistive value of transistors 56, 58, and 60 connected in series. Likewise, for delay in the negative voltage director or $V_{SS}$, the delay is determined by the resistive value of transistors 62, 64, and 66 connected in series.

FIG. 4 shows inverter circuitry 70 which allows for the impedance of power supplies $V_{CC}$ and $V_{SS}$, when utilized by inverter circuitry 70, to be modified, according to a second preferred embodiment of the invention. Inverter circuitry 70 is similar in function to inverter circuitry 50 of FIG. 3, except that additional circuitry makes it possible to introduce selectable delay. Inverter circuitry 70 inverts input signal 72 to produce output signal 74. P-channel transistors 76, 78, and 80 are connected in series with each other and connected to $V_{CC}$, as shown. Similarly, n-channel transistors 82, 84, and 86 are connected in series with each other and connected to $V_{SS}$.

In the positive voltage direction, transistors 88 and 90, corresponding to delay signals P1 and P2, respectively, allow for selectively choosing the positive voltage delay to be introduced to circuitry 70. Setting delay signals P1 and P2 equal to a logic low state causes transistors 76, 78, 80, 88 and 90 to be on, producing the smallest delay possible in a positive voltage direction. This minimum delay is possible because setting P1 to a logic low state causes the resistive values of transistors 76 and 88 to be connected in parallel which forms a first parallel resistive element 96, setting P2 to a logic low state causes the resistive value of transistor 90 to be connected in parallel with the series connection of the resistive value of transistor 78 and the first parallel resistive element which forms a second parallel resistive element 97. Therefore, the resultant resistance seen in a positive voltage direction is equal to the resistive value of transistor 80 connected in series with the resistive value of the second parallel resistive element 97. The width to length ratio of transistors 88 and 90 may be two to four times larger than the width to length ratio of transistors 76, 78, and 80, such that the resultant resistance is dominated by the resistive value of transistors 76, 78, and 80 rather than the resistive value of transistors 88 and 90.

The largest positive voltage delay possible for circuitry 70 of FIG. 4 may be realized by setting delay signals P1 and P2 to a logic high state. When delay signals P1 and P2 are both equal to a logic high state, transistors 88 and 90 are turned off, leaving only transistors 76, 78 and 80 on. Therefore, the delay is determined by the resistive value of transistor 76 in series with the resistive value of transistor 78 and the resistive value of transistor 80. Medium delay times may be introduced by setting delay signal P1 to a logic high level and delay signal P2 to a logic low level, or vice versa, in much the same way as described in FIG. 2. If even greater delay resolution in the positive voltage direction is desired, more series transistors may be connected in series to transistors 76, 78, and 80.

Delays in the negative voltage direction may be obtained by appropriately setting the logic state of delay signals N1 and N2. Values of delay signals N1 and N2 determine how the resistive values of transistors 82, 84, 86, 92, and 94 will affect the delay time. Setting delay signals N1 and N2 to a logic high state turns on transistors 92 and 94, and the resultant resistive value will be relatively small, causing a relatively small delay time. The resistive value of transistor 86 connected in parallel with the resistive value of transistor 92 defines a third parallel resistive element 98, and the resistive value of transistor 94 connected in parallel with the series connection of transistor 84 and the third parallel resistive element 98 defines a fourth parallel resistive element 99. In this case, the resultant resistive value in the negative voltage direction will be equal to the resistive value of transistor 82 connected in series with the fourth parallel resistive element 99, as defined above. The largest delay may be obtained by setting delay signals N1 and N2 each to a logic low state such that the resultant resistive value is equal to the resistive values of transistors 82, 84, and 86 connected in series. The width to length ratio of transistors 92 and 94 may be two to four times larger than the width to length ratio of transistors 82, 84, and 86, such that the resultant resistance is dominated by the resistive value of transistors 82, 84, and 86 rather than the resistive value of transistors 92 and 94.

The function of delay signals P1, P2, N1, and N2 shown in FIG. 4 has been described above. According to the present invention, these delay signals may be used to obtain global delay throughout an integrated circuit device. Referring to FIG. 4a, inverter circuitry 70 of FIG. 4 has been duplicated in a number of distributed circuit blocks Block0 to Block7, for instance, throughout an integrated circuit device such that by simply manipulating the four global delay signals P1, P2, N1, and N2, delays of differing amounts may be achieved throughout the device. This is a highly desirable feature of the present invention in that it allows for a single fuse to be blown, a single test pad to be forced to a given logic level, or a test mode to be entered in order to set a delay signal to the desired logic state.

Figure 5:
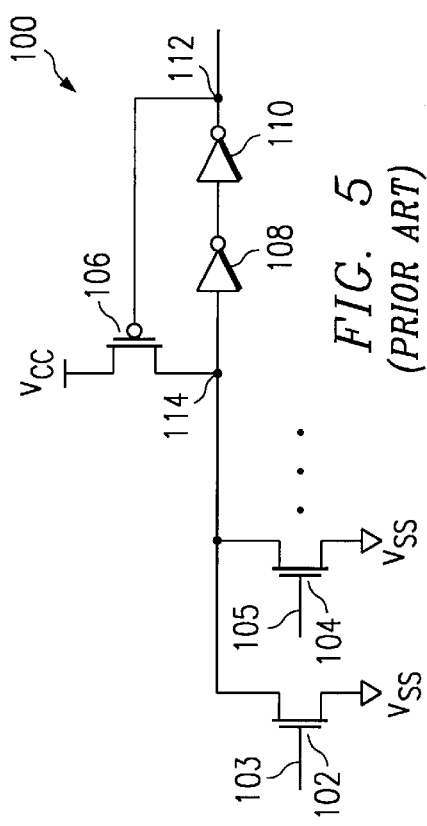
FIG. 5 is ETD circuitry, according to the prior art.

The introduction of global delay times may be used to control delays for sense amplifiers and edge transition detection (ETD) pulses. It often becomes important to be able to adjust the ETD pulse width to allow for thorough device characterization and device optimization. ETD circuitry 100, according to the prior art, is shown in FIG. 5. ETD circuitry 100 operates such that when any one of n-channel transistors 102 or 104 conducts because its gate signal, 103 or 105 respectively, is equal to a logic high state, node 114 is pulled to a logic low state ($V_{SS}$), and the output signal 112 of inverter 110 also goes to a logic low state. P-channel transistor 106 is turned on, and node 114, which feeds the input of inverter 108, is correspondingly pulled to a logic high state. When node 114 is pulled up to a sufficiently high logic state, output signal 112 goes to a logic high state and transistor 106 turns off.

The present invention may be used to adjust ETD pulse width. ETD circuitry 120 of FIG. 6 employs an adjustable delay block 130, to determine ETD pulse width, according to a third embodiment of the present invention. Adjustable delay block 130 is synonymous with the inverter circuitry shown in either FIG. 2 or FIG. 4, but may be replaced by circuitry which performs other logic functions, such as a NAND or a NOR logic function. As in FIG. 2 or FIG. 4, adjustable delay block 130 has multiple delay signals, such as P1 and P2 shown in FIGS. 2 and 4 which may be accordingly set to produce desired delay times in the positive voltage direction.

A plurality of n-channel transistors 122, 124 are connected in parallel to one another and connected to $V_{SS}$. Of course, additional n-channel transistors may be placed in parallel to transistors 122 and 124. When at least one of transistors 122 or 124 conducts because its gate signal, 123 or 125 respectively, is equal to a logic high state, node 136 is pulled to a logic low state ($V_{SS}$), and the output signal 134 of inverter 128 also goes to a logic high state. After some delay time determined by adjustable delay block 130, p-channel transistor 126 is turned on, causing node 136, which feeds the input signal of inverter 128, to be pulled up to a logic high state. When node 136 is pulled up to a sufficiently high logic state, output signal 134 goes to a logic low state, the output signal 131 of adjustable delay block 130 goes to a logic high state, and transistor 126 turns off.

Figure 6:
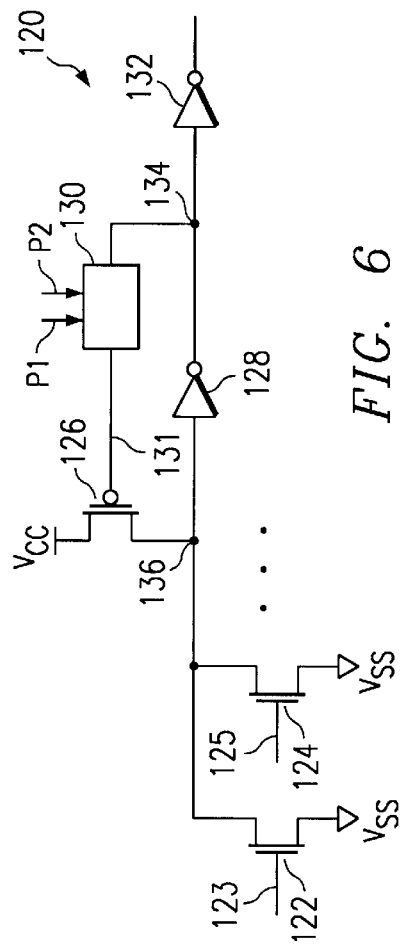
FIG. 6 is ETD circuitry which employs an adjustable delay block to determine ETD pulse width, according to a third embodiment of the present invention.
Figure 7A:
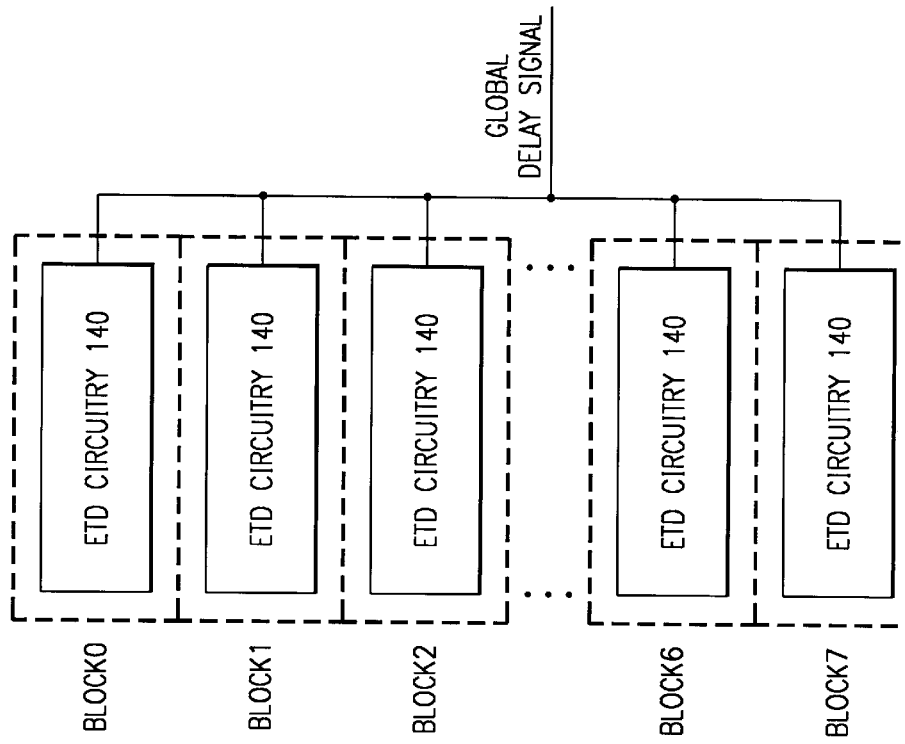
FIG. 7a is ETD circuitry 140 of FIG. 7 duplicated in a plurality of circuit blocks of an integrated circuit device.
Figure 7:
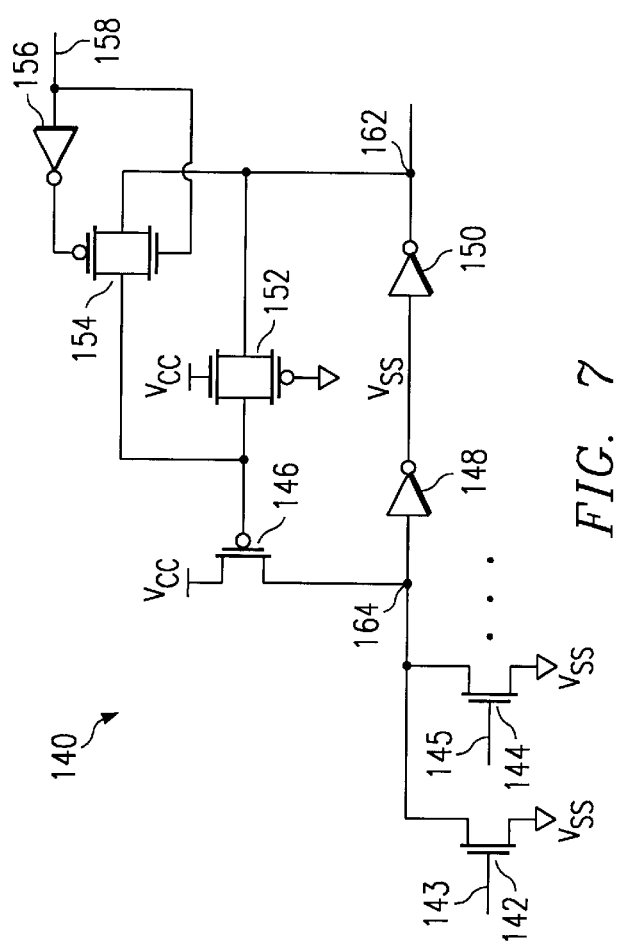
FIG. 7 is ETD circuitry which employs pass gate circuitry to determine ETD pulse width, according to a fourth embodiment of the present invention.

Referring now to FIG. 7, a fourth embodiment according to the present invention is shown for introducing delay to ETD circuitry 140. FIG. 7 is similar to ETD circuitry 120 of FIG. 6, with a major difference being the use of pass gates 152 and 154 to introduce delay to ETD circuitry 140 in FIG. 7. Delay signal 158 determines the resistive value connected in series with the gate of p-channel transistor 146, and thus the delay which will be introduced.

A plurality of n-channel transistors 142, 144, etc. are connected in parallel to one another and tied to $V_{SS}$. Of course, additional n-channel transistors may be placed in parallel to transistors 142 and 144. When at least one of transistors 142 or 144 conducts because its gate signal, 143 or 145 respectively, is equal to a logic high state, node 164 is pulled to a logic low state ($V_{SS}$), and the output signal 162 of inverter 150 also goes to a logic low state. After some delay dependent upon the resistive value of pass gate 152 in parallel with the resistive value of pass gate 154, p-channel transistor 146 turns on, if delay signal 158 is equal to a logic high state. As a result of transistor 146 being turned on, node 164, which feeds the input signal of inverter 148, is pulled up to a logic high state. When node 164 is pulled up to a sufficiently high logic state, transistor 146 will turn off.

Delay signal 158 determines how the resistive values of pass gate 152 and pass gate 154 will affect the delay introduced to ETD circuitry 140. When delay signal 158 is equal to a logic high state, pass gate 154 is turned on, meaning that the resulting resistance in series with the gate of p-channel transistor 146 is equal to the resistive value of pass gate 152 in parallel with the resistive value of pass gate 154. Since the resistance is lowered by having both pass gates 152 and 154 on and connected in parallel to each other, the resultant delay is correspondingly shorter than if pass gate 154 were not on. It then follows that when delay signal 158 is equal to a logic low state, pass gate 154 is turned off, and thus the resistance in series with the gate of p-channel transistor 146 is equal to the resistive value of pass gate 152. Since the resultant resistance is higher when delay signal 158 is equal to a logic low state, the delay introduced to ETD circuitry 40 is also higher.

The function of delay signals P1 and P2 of FIG. 6 and delay signal 158 of FIG. 7 has been described above. According to the present invention, these delay signals may be used to obtain global delay or to control pulse widths throughout an integrated circuit device. Referring to FIG. 6a, ETD circuitry 120 of FIG. 6 has been duplicated in a number of distributed circuit blocks Block0 to Block7, for instance, throughout an integrated circuit device such that by simply manipulating a global delay signal, delays of differing amounts may be achieved throughout the device. Similarly, referring to FIG. 7a, ETD circuitry 140 of FIG. 7 has been duplicated in a number of distributed circuit blocks Block0 to Block7, for instance, throughout an integrated circuit device such that by simply manipulating a global delay signal 158, delays of differing amounts may be achieved throughout the device. This is a highly desirable feature of the present invention in that it allows for a single fuse to be blown, a single test pad to be forced to a given logic level, or a test mode to be entered in order for a delay signal to be set to the desired logic state, and all delay elements connected to the delay signal are affected.

Four embodiments of the present invention for globally introducing adjustable delay or pulse width throughout an integrated circuit have been shown. These embodiments allows for blowing a single fuse, forcing a single test pad, or entering into a test mode to set a delay signal to the appropriate logic level. As previously mentioned, it is important to be able to blow a fuse to introduce desired delays to integrated circuitry for production devices, just as it is important to force a test pad to a given level during wafer testing and to enter a test mode during testing of the device. Additionally, the invention does not affect normal operation of an integrated circuit in which it is used and is layout efficient.

While the invention has been particularly shown and described with reference to a preferred embodiment, it will be understood by those skilled in the art that various changes in form and detail may be made therein without departing from the spirit and scope of the invention.

What is claimed is:

1. Edge transition detection (ETD) circuitry of an integrated circuit, comprising:
    a first supply voltage;
    a second supply voltage;
    a circuit element having a first transistor having a resistive value connected in series to the first supply voltage, a second transistor having a resistive value connected in series to the first transistor and the second supply voltage, a first element having a resistive value and connected in series with a gate terminal of the second transistor, and a second element having a resistive value and connected in parallel with the first element;
    a logic element having an input terminal coupled to a first node at which the first transistor and the second transistor are coupled and an output terminal coupled to a second node at which the first element and the second element are coupled; and
    a global delay signal which controls the second element, wherein when the global delay signal is equal to a first logic state, the second element is turned on and a first resultant resistance in series with the gate terminal of the second transistor, wherein the first resultant resistance is the resistive value of the second element in parallel with the resistive value of the first element, defines a first delay time which is introduced to the edge transition detection (ETD) circuitry of the integrated circuit at the second node; and when the global delay signal is equal to a second logic state, the second element is not turned on and a second resultant resistance in series with the gate terminal of the second transistor, wherein the second resultant resistance is the resistive value of the first element, defines a second delay time which is introduced to the edge transition detection (ETD) circuitry of the integrated circuit at the second node.

2. The circuitry of claim 1, wherein the first transistor is an n-channel transistor, the second transistor is a p-channel transistor, the first element is a pass gate, the second element in a pass gate, the first supply voltage is Vss, and the second supply voltage is Vcc.

3. The circuitry of claim 1, wherein the circuit element is one of a plurality of circuit elements located in a plurality of distributed circuit blocks throughout the integrated circuit.

4. The circuitry of claim 1, wherein the logic element is a plurality of serially connected inverters.

5. Edge transition detection (ETD) circuitry of an integrated circuit, comprising:
    a first resistive element of a circuit element, said circuit element having a first transistor connected in series to a first supply voltage, and a second transistor connected in series to a second supply voltage and the first transistor, wherein the first resistive element is connected in series with a gate of the second transistor;
    a second resistive element connected in parallel to the first resistive element;
    a logic element having an input terminal coupled to a first node at which the first transistor and the second transistor are coupled and an output terminal coupled to a second node at which the first resistive element and the second resistive element are coupled; and
    a global delay signal connected to the second resistive element which, when set to a first logic state, turns on the second resistive element and a first resultant resistance, wherein the first resultant resistance is a resistance of the first resistive element in parallel with the resistance of the second resistive element, introduces a first delay time to the edge transition detection (ETD) circuitry of the integrated circuit at the second node, and when set to a second logic state, the second resistive element is not turned on and a second resultant resistance, wherein the second resultant resistance is a resistance of the first resistive element, introduces a second delay time to the edge transition detection (ETD) circuitry of the integrated circuit at the second node.

6. The circuitry of claim 5, wherein the first resistive element and the second resistive element are pass gates.

7. The circuitry of claim 5, wherein the first logic state is $V_{CC}$ and the second logic state is $V_{SS}$.

8. The circuitry of claim 5, wherein the first logic state is $V_{SS}$ and the second logic state is $V_{CC}$.

9. The circuitry of claim 5, wherein the logic element is a plurality of serially connected inverters.

* * * * *